United States Patent
Hautala

(10) Patent No.: US 8,992,785 B2
(45) Date of Patent: Mar. 31, 2015

(54) METHOD FOR MODIFYING AN ETCH RATE OF A MATERIAL LAYER USING ENERGETIC CHARGED PARTICLES

(75) Inventor: John J. Hautala, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 781 days.

(21) Appl. No.: 12/688,405

(22) Filed: Jan. 15, 2010

(65) Prior Publication Data

US 2011/0174770 A1 Jul. 21, 2011

(51) Int. Cl.
*C23F 4/00* (2006.01)
*H01J 37/32* (2006.01)
*H01L 21/28* (2006.01)
*H01L 21/311* (2006.01)
*H01L 21/3213* (2006.01)
*H01L 29/66* (2006.01)

(52) U.S. Cl.
CPC .............. *C23F 4/00* (2013.01); *H01J 37/32357* (2013.01); *H01J 37/32412* (2013.01); *H01J 37/32422* (2013.01); *H01J 2237/0812* (2013.01); *H01J 2237/3151* (2013.01); *H01J 2237/316* (2013.01); *H01J 2237/3165* (2013.01); *H01J 2237/31701* (2013.01); *H01J 2237/3343* (2013.01); *H01L 21/28123* (2013.01); *H01L 21/31116* (2013.01); *H01L 21/31122* (2013.01); *H01L 21/32136* (2013.01); *H01L 21/32137* (2013.01); *H01L 29/66181* (2013.01)
USPC ............................................................ 216/13

(58) Field of Classification Search
CPC . H01L 29/66181; C23F 4/00; H01J 37/32412
USPC ................................ 216/62, 58, 67; 438/285
See application file for complete search history.

(56) References Cited

U.S. PATENT DOCUMENTS

| 7,060,989 B2 | 6/2006 | Swenson et al. | |
|---|---|---|---|
| 7,173,252 B2 | 2/2007 | Mack | |
| 7,190,007 B2* | 3/2007 | Breitwisch et al. | 257/149 |
| 2009/0170268 A1* | 7/2009 | Teo et al. | 438/285 |
| 2009/0263751 A1* | 10/2009 | Sivakumar et al. | 430/323 |

* cited by examiner

*Primary Examiner* — Nadine Norton
*Assistant Examiner* — Mahmoud Dahimene
(74) *Attorney, Agent, or Firm* — Wood, Herron & Evans, LLP

(57) ABSTRACT

A method of etching a material layer on a substrate is described. In one embodiment, the method includes modifying an etch resistance of a material layer to a pre-determined etch process by doping the material layer using energetic charged particles, and etching the modified material layer using the pre-determined etch process.

18 Claims, 12 Drawing Sheets

METHOD FOR MODIFYING AN ETCH RATE OF A MATERIAL LAYER USING ENERGETIC CHARGED PARTICLES

BACKGROUND OF THE INVENTION

1. Field of Invention

The invention relates to a method for modifying an etch rate of a material layer.

2. Description of Related Art

Typically, during fabrication of integrated circuits (ICs), semiconductor production equipment utilize a (dry) plasma etch process to remove or etch material along fine lines or within vias or contacts patterned on a semiconductor substrate. The success of the plasma etch process requires that the etch chemistry includes chemical reactants suitable for selectively etching one material while etching another material at a substantially lesser rate.

In present IC devices, exotic materials have been introduced to replace conventional materials used in semiconductor processing, thereby improving various electrical properties of the IC devices. For example, in front-end-of-line (FEOL) semiconductor processing, high dielectric constant (high-k) materials are desirable for use as transistor gate dielectrics. Preliminary high-k materials used in this role were tantalum oxide and aluminum oxide materials. Currently, hafnium-based dielectrics and possibly lanthanum-based dielectrics are expected to enter production as gate dielectrics, thereby replacing the current silicon oxide and silicon oxynitride materials. Moreover, in FEOL semiconductor processing, metal-containing materials are desirable for use as transistor gate electrodes in future generations of electronic devices. Currently, metal electrodes containing Ti, Ta, and/or Al (e.g., TiN, TaN, $Al_2O_3$, TiAl) are expected to enter production as metal electrodes, thereby fully or partly replacing the current polycrystalline gate electrode. Of course, the introduction of new materials to semiconductor processing is not limited to only FEOL operations, but is also a trend in metallization processes for back-end-of-line (BEOL) operations. Moreover, in memory devices, new and exotic materials are used and introduced.

With current materials and the advent of these new materials in electronic device processing, the ability to etch these old and new materials while maintaining the integrity of pre-existing layers and/or structures faces formidable challenges. Conventional etch processes may not achieve practical etch rates of these materials or attain an acceptable etch selectivity relative to underlying or overlying materials.

SUMMARY OF THE INVENTION

The invention relates to a method for modifying an etch rate of a material layer. The invention further relates to a method for modifying an etch rate of a material layer using energetic charged particles.

According to one embodiment, a method of etching a material layer on a substrate is described. The method comprises doping at least a portion of a material layer on a substrate using energetic charged particles to modify an etch resistance of the material layer to a pre-determined etch process, and etching the material layer following the doping using the pre-determined etch process.

According to another embodiment, a method of etching a material layer on a substrate is described. The method comprises forming a material layer on a substrate, and forming another material layer on the substrate. The method further comprises doping the material layer using energetic charged particles, and following the doping, differentially etching the material layer and the other material layer, wherein doping the material layer modifies an etch selectivity between the material layer and the other material layer relative to a nominal etch selectivity achievable by the etching without the doping.

DETAILED DESCRIPTION OF SEVERAL EMBODIMENTS

Figure 1:
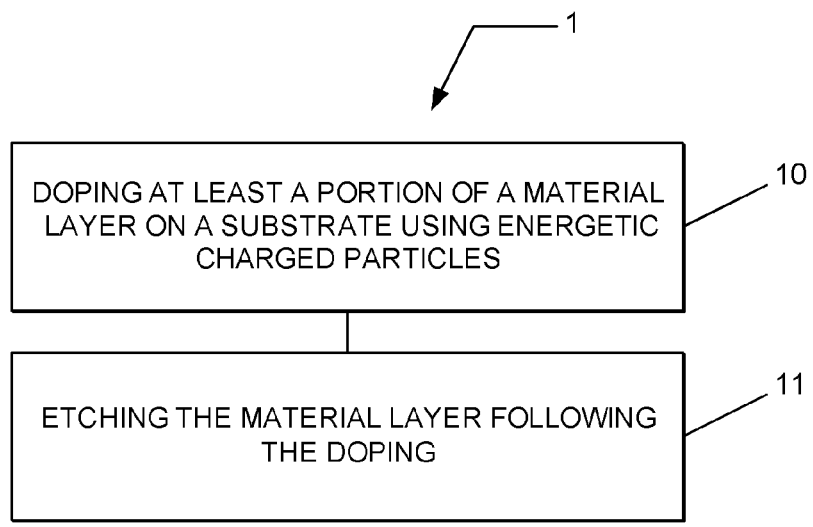
FIG. 1 is a flow chart illustrating a method of etching a material layer according to an embodiment.

A method and system for etching a material layer on a substrate by modifying an etch resistance of the material layer using a charged particle beam, such as a gas cluster ion beam (GCIB), is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

As described above, in material processing such as semiconductor material processing, there is a general need for etching various surfaces of a substrate. In particular, there is a need to etch a material layer with sufficient etch selectivity to other material layers on the substrate. For example, during pattern etching, a dry plasma etching process can be utilized, wherein plasma is formed from a process gas by coupling electro-magnetic (EM) energy, such as radio frequency (RF) power, to the process gas in order to heat electrons and cause subsequent ionization and dissociation of the atomic and/or molecular composition of the process gas. Using a series of dry etching processes, the pattern formed in the initial mask layer, using for instance a photo-lithographic process, is transferred to the underlying layers within a film stack, including the one or more material layers that are desired for the end product, e.g., electronic device. However, as identified above, current materials and the advent of new materials and their integration in the end product pose formidable challenges for conventional etch processes.

The inventor has discovered that the ability to etch a particular material layer on a substrate may be altered by modifying the material layer prior to performing the etching process. For example, a material layer having either a deficiency or surplus of a specific element not present or already present in the material layer may be subjected to treatment containing the element in order to adjust, i.e., increase or decrease, a concentration of the element in the material layer. The resultant change in the composition of the material layer may facilitate modification of an etch resistance to a pre-determined etch process.

Referring now to the drawings wherein like reference numerals designate corresponding parts throughout the several views, a method of etching a material layer on a substrate is illustrated in FIG. 1 according to one embodiment. The method includes a flow chart 1 beginning in 10 with doping at least a portion of a material layer on the substrate using energetic charged particles to modify an etch resistance of the material layer to a pre-determined etch process. The doping may alter an etch selectivity of the material layer relative to another material layer on the substrate when subjected to the pre-determined etch process. The material layer may be formed using any conventional technique including, but not limited to, thin film spin-on techniques and thin film vapor deposition techniques.

The material layer may comprise a conductive, non-conductive, or semi-conductive material. The material layer may comprise silicon, a metal, or a metal alloy, or any combination of two or more thereof. For example, the metal may include Ti, Zr, Hf, Ta, W, Re, Ru, Co, Rh, Ni, Cu, Fe or Al, or any combination of two or more thereof. The material layer may comprise an oxide. For example, the oxide may comprise silicon oxide ($SiO_x$), a silicon oxynitride ($SiO_xN_y$), a metal silicate ($MSiO_x$), a metal silicon oxynitride ($MSiO_xN_y$), or a metal oxide ($MO_x$). The material layer may comprise a nitride. For example, the nitride may comprise silicon nitride ($SiN_y$), silicon oxynitride ($SiO_xN_y$), boron nitride ($BN_y$), a metal silicon oxynitride ($MSiO_xN_y$), a metal silicon nitride ($MSiN_y$), or a metal nitride ($MN_y$). The material layer may comprise a carbide. For example, the carbide may comprise silicon carbide ($SiC_y$), silicon oxycarbide ($SiO_xC_y$), silicon carbonitride ($SiC_xN_y$), silicon oxycarbonitride ($SiO_xC_yN_z$), a metal carbide ($MC_y$), a metal carbonitride ($MC_xN_y$), or a metal oxycarbonitride ($MO_xC_yN_z$). Additionally, the material layer may comprise $HfO_2$, $HfSi_xO_y$, $ZrO_2$, $ZrSi_xO_y$, $TiO_2$, $Ta_2O_5$, a rare earth oxide, mixed rare earth oxide, rare earth nitride, mixed rare earth nitride, rare earth oxynitride, mixed rare earth oxynitride, aluminum oxide, aluminum nitride, rare earth aluminum oxide, mixed rare earth aluminum oxide, rare earth aluminum nitride, mixed rare earth aluminum nitride, rare earth aluminum oxynitride, or mixed rare earth aluminum oxynitride. Additionally yet, the material layer may comprise CoFe or NiFe.

The doping of the material layer using the energetic charged particles may include introducing a dopant using a gas cluster ion beam (GCIB) process, an ion beam implant process, or a plasma immersion ion implant process, or any combination of two or more thereof.

The doping of the material layer may include introducing one or more elements selected from the group consisting of B, C, Si, Ge, N, P, As, O, S, F, Cl, and Br. Additionally, the doping of the material layer may include adjusting a concentration profile of any one or more of these elements through the thickness of the material layer.

The selected element or elements may or may not be present in the material layer prior to doping. An initial concentration of an element present in the material layer may be modified to a final concentration by exposing the material layer to the charged particle beam containing the element. Herein, modification of a material layer may include adjusting the concentration of an atomic element or molecular arrangement of elements present in the material layer. The concentration of the atomic element or molecular arrangement of elements present in the material layer may be adjusted at one or more sub-layers or regions within the material layer using one or more charged particle beam treatments. For example, the concentration profile of the atomic element or molecular arrangement of elements present in the material layer may be adjusted using one or more GCIB treatments. In one embodiment, a concentration of an element present or not present at various depths in the material layer is increased using one or more GCIB treatments. In another embodiment, a concentration of an element present at various depths in the material layer is decreased using one or more GCIB treatments. In yet another embodiment, a concentration of a first element present or not present in the material layer is increased and a concentration of a second element present in the material layer is decreased using the one or more GCIB treatments. In even yet another embodiment, a concentration of a first element present in the material layer is modified, and a second element is introduced to the material layer.

According to one example, the initial concentration of the element in the material layer may be adjusted such that the final concentration of the element provides a substantially stoichiometric relationship between the element and the other elements in the material layer. According to another example, the oxygen and/or nitrogen content in a silicon-containing and/or metal-containing material layer may be increased. According to yet another example, the oxygen and/or nitrogen content in a silicon-containing and/or metal-containing material layer may be decreased. According to even yet another example, the silicon content in a metal-containing material layer may be increased or decreased.

In addition to modifying one or more properties in the material layer, the material layer to be treated may be pre-treated or post-treated. For example, the material layer may be subjected to GCIB treatment, such as irradiation by an inert beam, before or after the doping process described above. Additionally, for example, the material layer may be exposed to an inert GCIB, such as an Ar GCIB, prior to the doping process in order to alter the penetration depth of the ensuing doping process.

Furthermore, the material layer may be annealed following doping of the material layer. The material layer may be annealed via a thermal treatment, wherein the temperature of the material layer is elevated to a material-specific temperature for a period of time. The temperature and the time for the annealing process may be adjusted in order to vary the properties of the material layer. For example, the temperature of the material layer may be elevated to a value greater than about 800 degrees C. Additionally, for example, the temperature of the material layer may be elevated to a value greater than about 850 degrees C. Additionally yet, for example, the temperature of the material layer may be elevated to a value greater than about 900 degrees C. Furthermore, for example, the time for the annealing process may be greater than about 1 millisecond. The annealing process may be performed at atmospheric pressure or reduced pressure. Additionally, the annealing process may be performed with or without an inert gas atmosphere. Furthermore, the annealing process may be performed in a furnace, a rapid thermal annealing (RTP) system, a flash lamp annealing system, or a laser annealing system.

According to one embodiment, the doping comprises: establishing a GCIB containing a dopant; selecting a beam energy, a beam energy distribution, a beam focus, and a beam dose to achieve a desired concentration profile of the dopant in the material layer; accelerating the GCIB to achieve the beam energy; focusing the GCIB to achieve the beam focus; irradiating the accelerated GCIB onto at least a portion of the material layer according to the beam dose; and introducing the dopant to the at least a portion of the material layer to achieve the desired concentration profile of the dopant.

A GCIB is established having an energy per atom ratio ranging from about 0.25 eV per atom to about 100 eV per atom. Alternatively, the GCIB is established having an energy per atom ratio ranging from about 0.25 eV per atom to about 10 eV per atom. Alternatively, the GCIB is established having an energy per atom ratio ranging from about 1 eV per atom to about 10 eV per atom. The GCIB can be formed in a GCIB processing system, such as any of the GCIB processing systems (100, 100' or 100") described below in FIG. 5, 6 or 7, or any combination thereof.

The substrate comprising the material layer is provided in a reduced-pressure environment in a GCIB processing system. The substrate can be positioned on a substrate holder and may be securely held by the substrate holder. The temperature of the substrate may or may not be controlled. For example, the substrate may be heated or cooled during a film forming process. The environment surrounding the substrate is maintained at a reduced pressure.

A GCIB is generated in the reduced-pressure environment, and can be generated from a pressurized gas mixture. The pressurized gas mixture may use a material source comprising one or more gases containing elements selected from the group consisting of He, Ne, Ar, Kr, Xe, B, C, Si, Ge, N, P, As, O, S, F, and Cl. For example, the material source comprises $SiH_4$, $Si_2H_6$, $SiH_2Cl_2$, $SiCl_3H$, methylsilane, dimethylsilane, trimethylsilane, tetramethylsilane, ethylsilane, diethylsilane, triethylsilane, tetraethylsilane, $SiCl_4$, $SiF_4$, $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $N_2$, $H_2$, $O_2$, NO, $NO_2$, $N_2O$, $NH_3$, $NF_3$, HCl, $SF_6$, CO, $CO_2$, $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, $C_6H_{12}$, $BF_3$, $B_2H_6$, $AsH_3$, $AsF_5$, $PH_3$, $PF_3$, $PCl_5$, or $PF_5$, or any combination of two or more thereof.

Furthermore, the pressurized gas mixture may comprise an optional inert gas. The optional inert gas may comprise a noble gas.

A beam acceleration potential, a beam dose, and/or a cluster size can be selected. The beam acceleration potential, the beam dose, and/or the cluster size can be selected to achieve pre-specified properties in the one or more material layers. For example, the beam acceleration potential, cluster size, and/or beam dose may be adjusted to alter the material properties of the material layer, i.e., as will be described below, alter a concentration of one or more species within the material layer, a concentration profile of one or more species within the material layer, or depth of one or more species within the material layer, or any combination thereof. The beam acceleration potential may range up to 100 kV, the cluster size may range up to several tens of thousands of atoms, and the beam dose may range up to about $1\times10^{17}$ clusters per $cm^2$. For example, the beam acceleration potential may range from about 1 kV to about 70 kV (i.e., the beam energy may range from about 1 keV to about 70 keV). Additionally, for example, the beam dose may range from about $1\times10^{15}$ clusters per $cm^2$ to about $1\times10^{17}$ clusters per $cm^2$.

The beam acceleration potential may be used to modify the depth of penetration of the one or more elements in the material layer, i.e., increasing the beam acceleration potential increases the depth and decreasing the beam acceleration potential decreases the depth. Additionally, the beam dose may be used to modify the concentration of the one or more elements in the material layer, i.e., increasing the beam dose increases the final concentration and decreasing the beam dose decrease the final concentration. The GCIB is accelerated according to the beam acceleration potential, and the substrate is exposed to the GCIB according to the beam dose.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

The inventor has discovered that a range of energy, in particular a range of energy per atom ratio, for the GCIB treatment is optimal for modifying a material layer and for modifying a material layer to adjust a concentration of one or more species present in the material layer. For example, the energy per atom ratio may range from about 0.25 eV per atom to about 100 eV per atom. Alternatively, for example, the energy per atom ratio may range from about 0.25 eV per atom to about 10 eV per atom. Alternatively, for example, the energy per atom ratio may range from about 1 eV per atom to about 10 eV per atom. The energy per atom ratio may be used to adjust the concentration of one or more elements present or not present in the material layer and/or the depth to which the one or more elements are present in the material layer. For instance, while decreasing the energy per atom ratio, the adjusted depth may be decreased. Alternatively, while increasing the energy per atom ratio, the adjusted depth may be increased.

The establishment of the GCIB having a desired energy per atom ratio may include selection of a beam acceleration potential, a stagnation pressure for formation of the GCIB, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, an increase in the stagnation pressure during formation of the GCIB causes an increase in the cluster size (i.e., number of atoms per cluster) and, consequently, a decrease in the energy per atom ratio for a given beam acceleration potential.

Additionally yet, other GCIB properties may be varied to adjust the doping or modification of the material layer including, but not limited to, beam energy distribution, cluster size distribution, or gas nozzle design (such as nozzle throat diameter, nozzle length, and/or nozzle divergent section half-angle).

Thereafter, in 11, the material layer is etched following the doping using the pre-determined etch process. The pre-determined etch process may comprise a wet etch process, a dry etch process, a dry plasma etch process, a dry non-plasma etch process, a chemical oxide removal process, an ion milling process, or a GCIB process, or any combination of two or more thereof. For example, the pre-determined etch process may comprise forming plasma from a halogen-containing gas. The inventor has observed that by doping the material layer prior to etching, the etch rate of the material layer is increased or decreased when using the pre-determined etch process. In some cases where etching the material layer using a desired pre-determined etch process is not feasible, doping the material layer enables etching of the material layer by the desired etch process. In some cases where etching the material layer using the pre-determined etch process is feasible but undesirable, doping the material layer prevents or substantially prevents etching of the material layer by the pre-determined etch process. For example, where more than one material layer is exposed to an etchant in a differential etching process, the doping may prevent or substantially prevent etching of the modified material layer and selective etching of another material layer.

The method of etching described in FIG. 1 may be utilized to etch any thickness for the material layer. As an example, the thickness of the material layer may range from about 1 nm (nanometer) to about 50 nm. For thicker material layers where the penetration depth of the dopant is less than the thickness of the material layer, the doping and the etching of the material layer may be performed alternatingly and sequentially.

Figure 2:
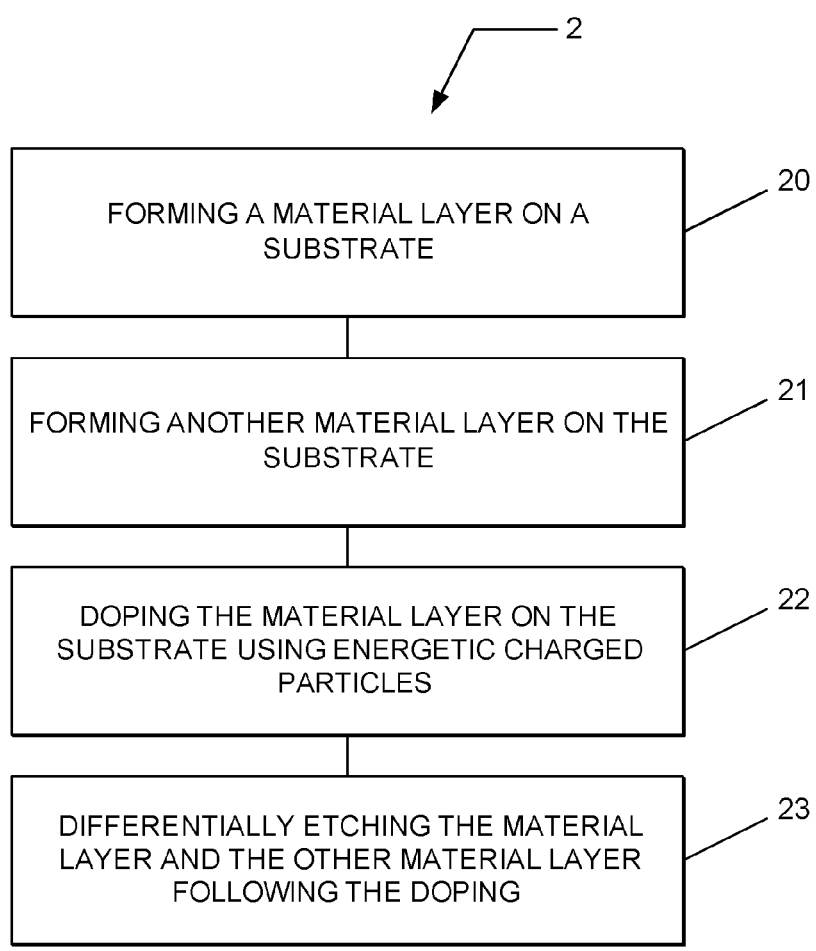
FIG. 2 is a flow chart illustrating a method of etching a material layer according to another embodiment.

According to another embodiment, a method of etching a material layer on a substrate is illustrated in FIG. 2. The method includes a flow chart 2 beginning in 20 with forming a material layer on a substrate. The material layer may be formed using any conventional technique including, but not limited to, thin film spin-on techniques and thin film vapor deposition techniques.

In 21, another material layer is formed on the substrate. The other material layer may be formed using any conventional technique including, but not limited to, thin film spin-on techniques and thin film vapor deposition techniques. The material layer and/or the other material layer may comprise a conductive, non-conductive, or semi-conductive material. The other material layer may have a different composition than the material layer.

In 22, at least a portion of the material layer on the substrate is doped using energetic charged particles. The other material layer may or may not be doped during the doping. The doping of the material layer may include introducing one or more elements selected from the group consisting of B, C, Si, Ge, N, P, As, O, S, F, Cl, and Br. For example, the doping using energetic charged particles may include using a GCIB process, an ion beam implant process, or a plasma immersion ion implant process, or any combination of two or more thereof.

In 23, following the doping, the material layer and the other material layer are differentially etched, i.e., the material layer and the other material layer are etched at different etch rates. The doping of the material layer modifies an etch selectivity between the material layer and the other material layer (e.g., a ratio of the etch rate of the material layer to the etch rate of the other material layer) relative to a nominal etch selectivity achievable by the etching without the doping. A pre-determined etch process is established for etching the material layer and/or the other material layer with the nominal etch selectivity between the material layer and the other material layer. By doping the material layer and optionally the other material layer, a modified etch selectivity is achieved that is greater or lesser than the nominal etch selectivity.

Various embodiments have been described for etching a material layer on a substrate, wherein an etch resistance of the material layer or another material layer on the substrate is modified prior to etching. It should be noted that these etching techniques, described above, may be used when blanket etching or pattern etching one or more regions of a blanket substrate or a patterned substrate. As one of ordinary skill in the art of pattern etching would recognize, a patterned mask layer may be formed that may include, but not be limited to, a lithographic layer, such as a layer of radiation-sensitive material or photo-resist, an anti-reflective coating (ARC) layer, an organic planarization layer (OPL), a soft mask layer, or a hard mask, layer, or any combination of two or more thereof.

The methods of etching described above may be utilized in a number of applications for semiconductor device and electronic device production including, but not limited to, logic devices, memory devices, and various structures formed therein including transistors, capacitors, and metal interconnects. Moreover, the methods of etching described above may be utilized in volatile memory, such as DRAM (dynamic random access memory) or SRAM (static random access memory), and non-volatile memory, such as ReRAM (resistive random access memory).

According to one example, a method of etching a film stack, such as a transistor gate stack having a metal gate, is illustrated in FIGS. 3A through 3D. As shown in FIGS. 3A through 3D, a film stack 500 comprising a plurality of layers 520 through 570 formed on a substrate 510 is illustrated. The film stack 500 may, for example, include a polycrystalline silicon (polysilicon, or poly-Si) gate stack having a polysilicon layer 550, a metal-containing layer 540, and a high dielectric constant (high-k) dielectric layer 530 as the gate dielectric or part of the gate dielectric. The metal-containing layer 540 can, for example, be part of a poly-Si gate electrode. The metal-containing layer 540 may be several hundred Angstroms (Å) thick, for instance, about 100 Å thick, and it may comprise a metal nitride. For example, metal-containing layer 540 may contain titanium nitride (TiN), titanium silicon nitride, titanium aluminum nitride, tantalum nitride, tantalum silicon nitride, hafnium nitride, hafnium silicon nitride, or aluminum nitride. The metal-containing layer 540 in the gate electrode can replace or be integrated with the traditional poly-Si gate electrode layer.

Furthermore, the gate dielectric may further include an interfacial layer 520, such as a thin layer of silicon dioxide ($SiO_2$) between the high-k dielectric layer 530 and the substrate 510. The high-k dielectric layer 530 may, for example, comprise a hafnium containing layer, such as a hafnium oxide layer (e.g., $HfO_2$) or hafnium silicate layer (e.g., HfSiO). Additionally, for example, the high-k dielectric layer 530 may incorporate metallic silicates or oxides (e.g., $Ta_2O_5$ (k~26), $TiO_2$ (k~80), $ZrO_2$ (k~25), $Al_2O_3$ (k~9), HfSiO, $HfO_2$ (k~25)). Furthermore, for example, the high-k dielectric layer 530 may include mixed rare earth oxides, mixed rare earth aluminates, mixed rare earth nitrides, mixed rare earth aluminum nitrides, mixed rare earth oxynitrides, or mixed rare earth aluminum oxynitrides.

The film stack 500 further comprises a patterned mask layer 580, such as a layer of photo-resist having a pattern formed therein using a photo-lithographic process. Additionally, for example, the film stack 500 may include an anti-reflective coating (ARC) layer 570 for use in patterning the mask layer 580, and one or more hard mask layers 560, such as a silicon dioxide ($SiO_2$) hard mask for dry etching the polysilicon layer 550.

Figure 3A:
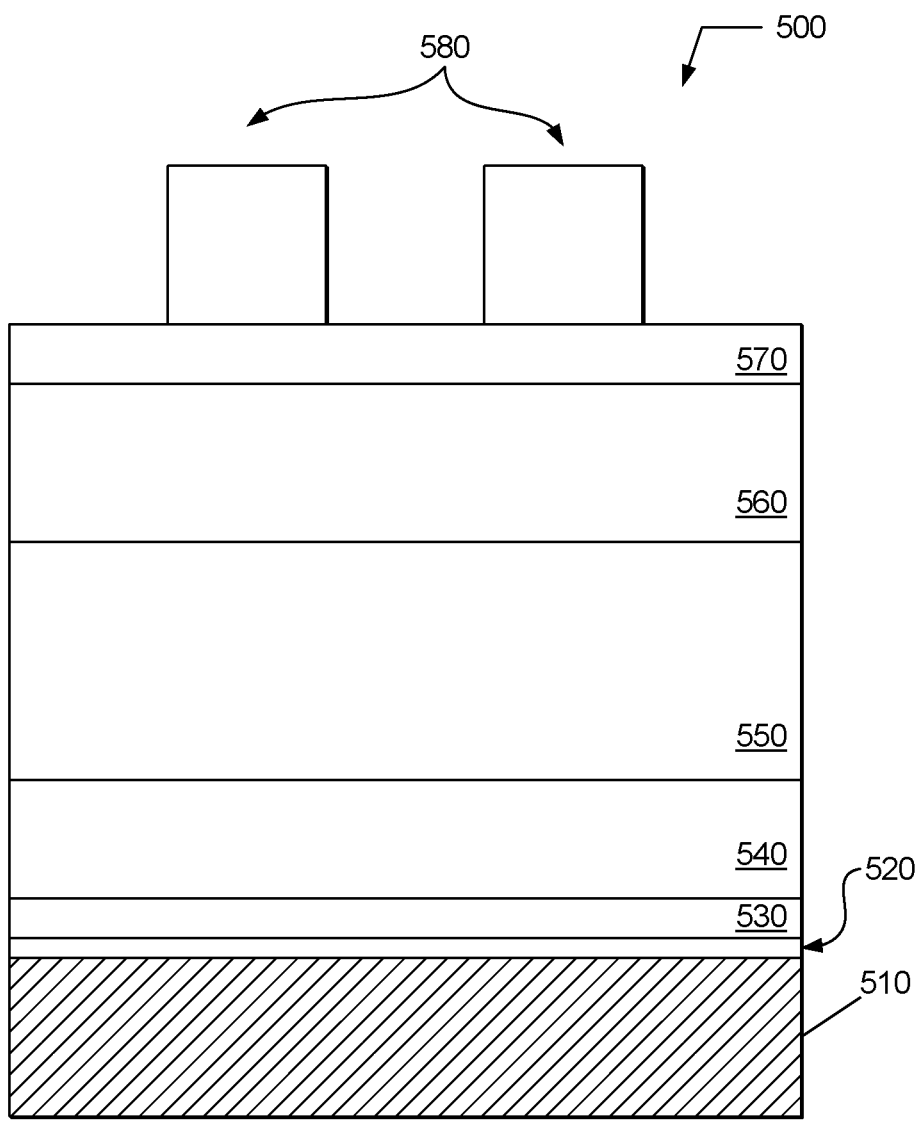
FIGS. 3A through 3D illustrate a method of etching a transistor gate film stack according to an embodiment.
Figure 3B:
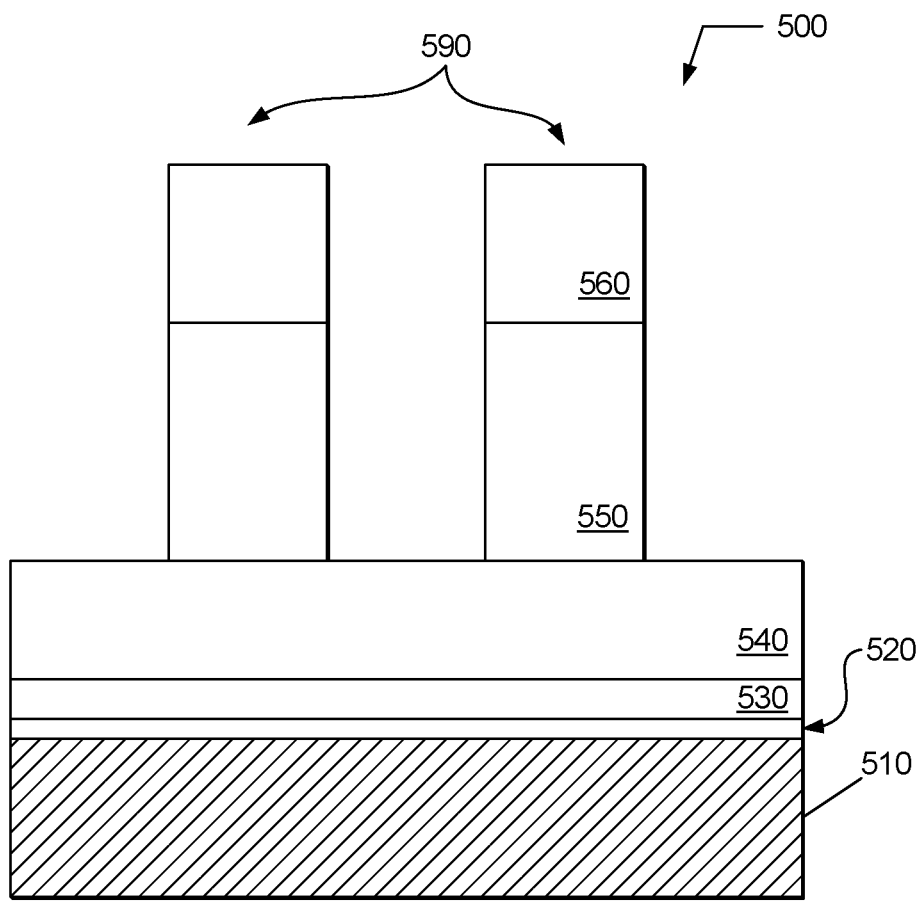

As illustrated in FIG. 3B, a series of etching processes for transferring the pattern to the underlying stack of films, including the one or more hard mask layers 560 and the polysilicon layer 550, is selected to preserve the integrity of the pattern being transferred, e.g., critical dimensions, etc., as well as minimize damage to those layers which are utilized in the electronic device being fabricated. Once the metal-containing layer 540 or high-k dielectric layer 530 are reached, a method of etching, such as described above, may be implemented to facilitate and/or improve pattern transfer to these layers when integrating new materials in the gate stack 500.

Figure 3C:
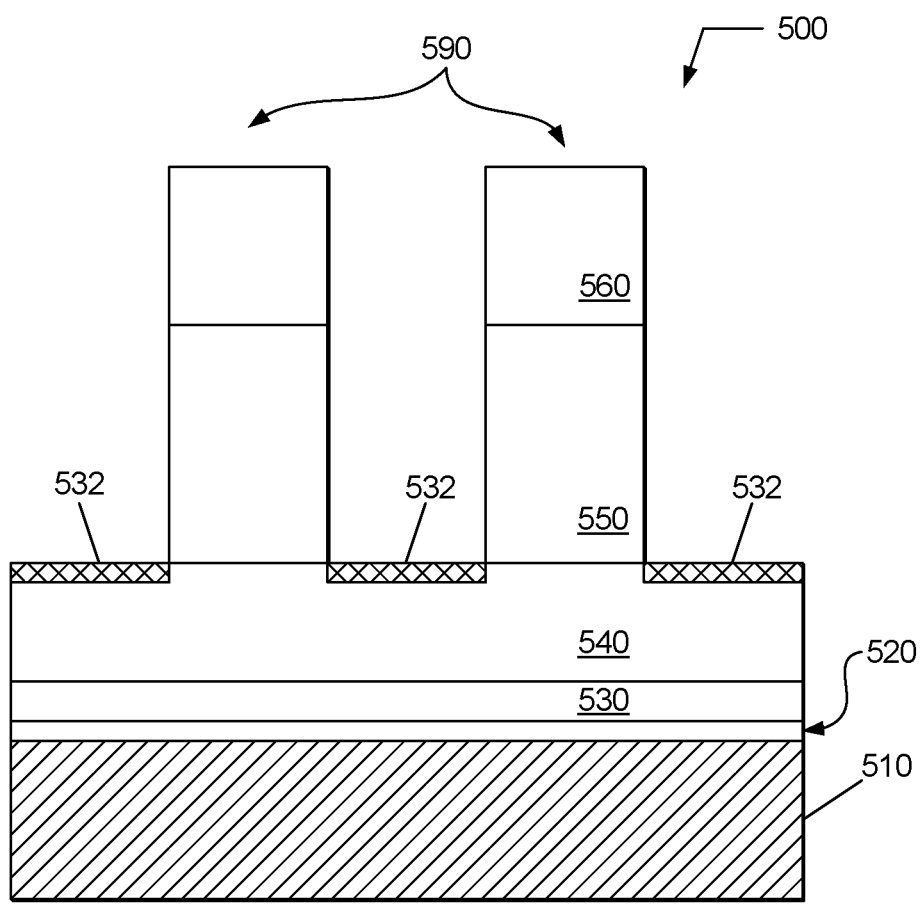
Figure 3D:
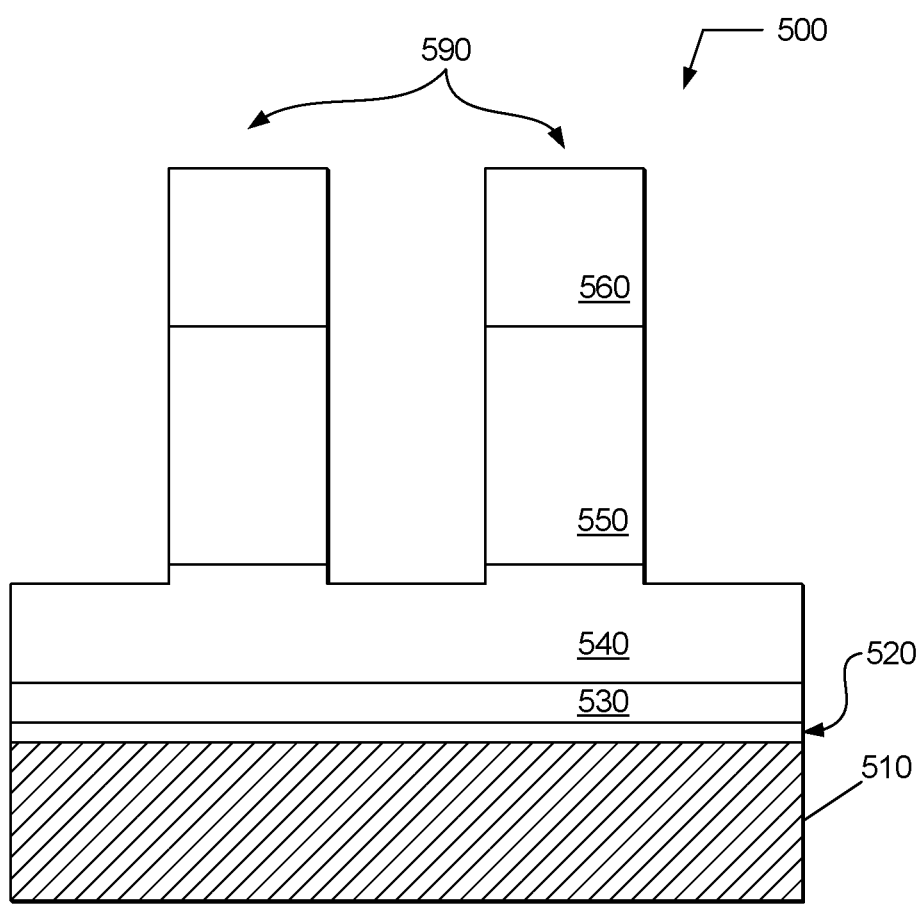

As shown in FIG. 3C, the exposed regions of the metal-containing layer 540 may be doped using a charged particle beam to form doped regions 532, and then may be etched to remove the doped regions 532 as shown in FIG. 3D. The doped regions 532 may or may not extend through the thickness of the metal-containing layer 540. The doping and etching may be alternatingly and sequentially performed until the pattern extends through the metal-containing layer 540. Although not described, this method of etching may be extended also to the high-k dielectric layer 530.

For example, oxygen (O) may be introduced to metal-containing layer 540. Additionally, a dopant, such as oxygen (O), may be introduced to the one or more hard mask layers 560 and/or the polysilicon layer 550. Furthermore, for example, the one or more hard mask layers 560 may be removed from or excluded in the film stack 500, and a dopant, such as oxygen (O), may be introduced to the polysilicon layer 550. When etching the metal-containing layer 540 using a halogen-containing plasma, such as plasma containing HBr, $Cl_2$, or $BCl_3$, the introduction of O to the metal-containing layer 540 may increase the etch rate of the metal-containing layer 540, while the introduction of O to the polysilicon layer 550 may decrease the etch rate of the polysilicon layer 550.

Figure 4A:
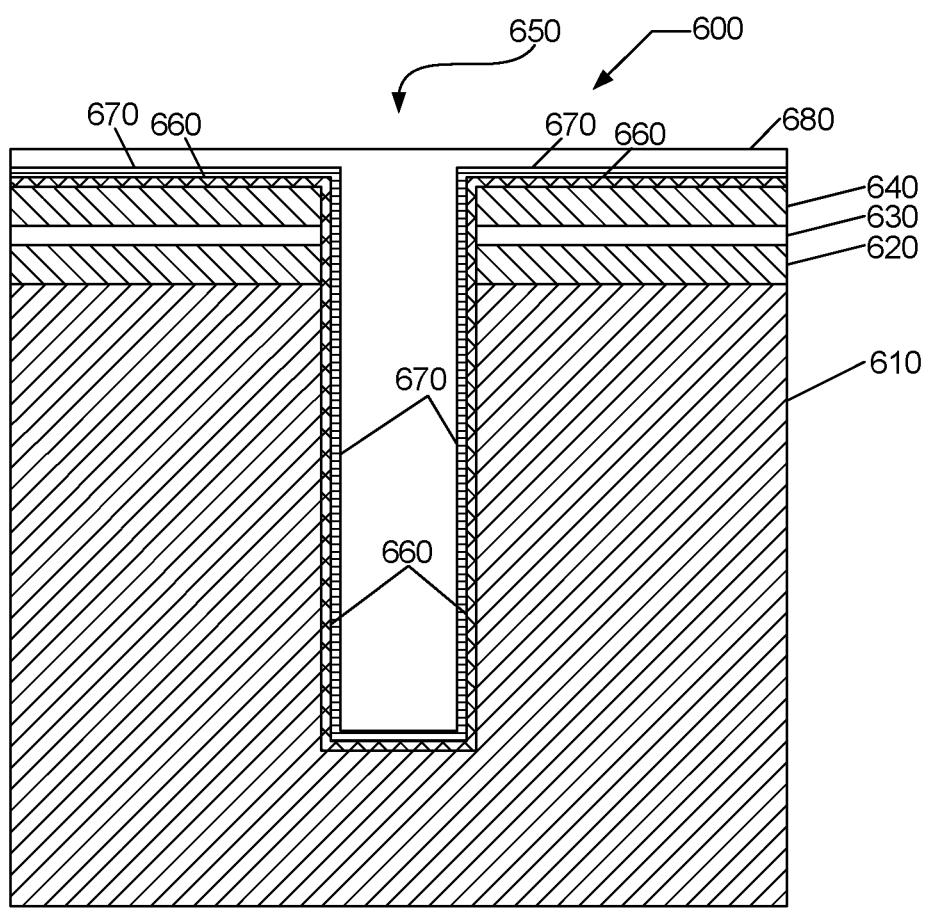
FIGS. 4A and 4B illustrate a method of etching a trench/buried capacitor according to an embodiment.
Figure 4B:
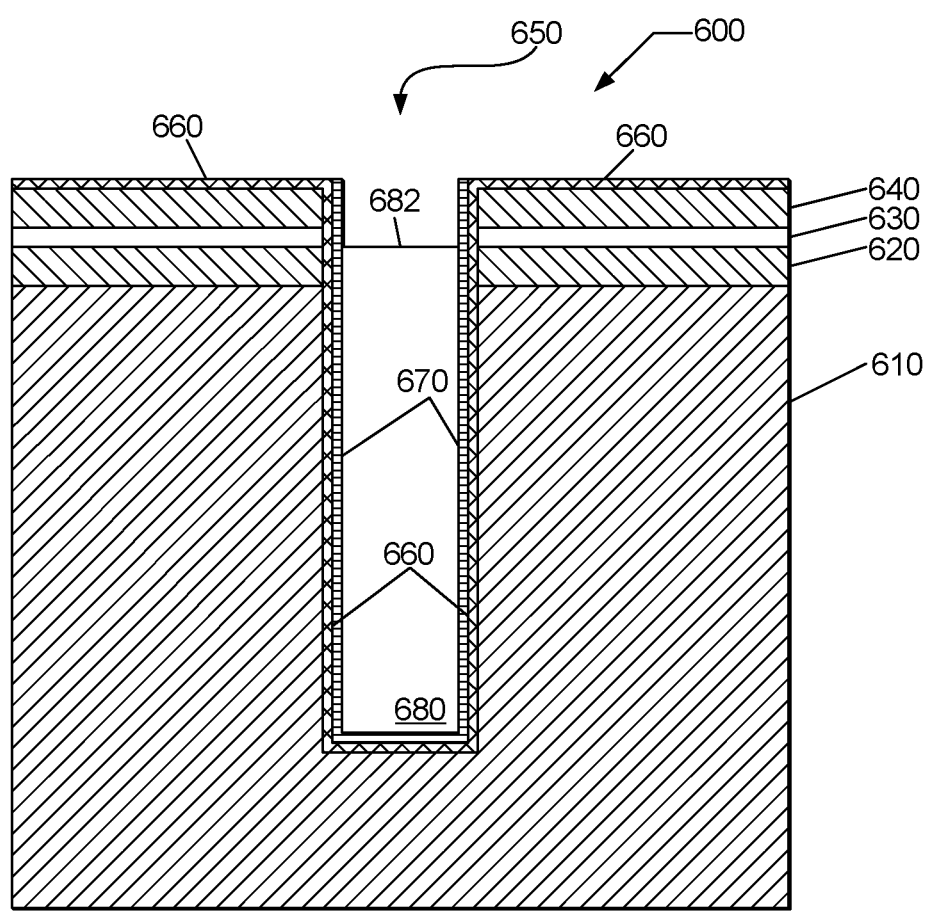

According to another example, a method of etching a liner in a trench/buried capacitor is illustrated in FIGS. 4A and 4B. As shown in FIG. 4A, a trench 650 is formed through one or more layers (620, 630, 640) and into substrate 610. The formation of trench 650 may include one or more dry etching processes, or one or more wet etching processes, or a combination thereof. The one or more layers formed on substrate 610 may include a pad oxide layer 620, an intermediate layer 630, and a stop layer 640. For example, the pad oxide layer 620 may include silicon oxide ($SiO_x$), the intermediate layer 630 may include silicon, and the stop layer 640 may include silicon nitride ($SiN_y$). The stop layer 640 may also include a carbide (e.g., $SiC_x$) layer, an oxynitride (e.g., $SiO_xN_y$) layer, a carbonitride (e.g., $SiC_xN_y$) layer, or other dielectric layer, which resists erosion during subsequent planarization and etching.

The pad oxide layer 620 may be provided atop the substrate 610, for example, either by deposition or by oxidizing process (es). In the latter, oxidation may include heating the substrate 610 in an oxygen ambient at high temperature (e.g., 800 degrees C. to about 1100 degrees C.) until the oxide is formed on the surface of the substrate 610. It is also possible to form the pad oxide layer 620 by conventional deposition processes such as, but not limited to: chemical vapor deposition (CVD), plasma-enhanced CVD (PECVD), atomic layer deposition (ALD), plasma enhanced ALD (PEALD), or physical vapor deposition (PVD). The intermediate layer 630 and the stop layer 640 also may be formed using vapor deposition processes such as, but not limited to: CVD, PECVD, ALD, PEALD, or PVD.

Once the trench 650 is formed in substrate 610, a conformal liner 660 is deposited within the trench 650. The conformal liner 660 may include a dielectric material, such as a high dielectric constant (high-k) material. The high-k dielectric material may have a dielectric constant greater than 4. For instance, the high-k dielectric material may include an oxide, such as a metal oxide. Additionally, for instance, the high-k dielectric material may include aluminum oxide ($Al_2O_3$), lanthanum oxide ($La_2O_3$), zirconium oxide ($ZrO_2$), hafnium oxide ($HfO_2$), an aluminate such as hafnium aluminate (HfAlO), zirconium silicate ($ZrSiO_4$), hafnium silicate ($HfSiO_4$), or hafnium silicon oxynitride (HfSiON). Additionally, for instance, the high-k dielectric material may include mixtures of high-k materials. The conformal liner 660 may be deposited using a vapor deposition process such as, but not limited to: CVD, PECVD, ALD, PEALD, or PVD.

The trench 650 is filled with a bulk fill material 680. The bulk fill material 680 may serve as an electrode or part of an electrode in a trench/buried capacitor. The bulk fill material 680 may include polycrystalline silicon (poly-silicon). The trench fill process may include a vapor deposition process such as, but not limited to: CVD, PECVD, or PVD.

Additionally, an electrode layer 670 may be disposed between the conformal liner 660 and the bulk fill material 680. The electrode layer 670 may include undoped poly-silicon, doped poly-silicon, tantalum (Ta), tantalum nitride (TaN), tantalum titanium (TaTi), tantalum platinum (TaPt), tantalum silicon nitride (TaSiN), titanium (Ti), titanium nitride (TiN), titanium aluminide ($Ti_3Al$), titanium aluminum nitride ($Ti_2AlN$), tungsten (W), tungsten nitride (WN), tungsten silicide (WSi), hafnium (Hf), hafnium nitride (HfN), niobium (Nb), molybdenum (Mo), molybdenum nitride ($Mo_2N$), ruthenium (Ru), ruthenium dioxide ($RuO_2$), nickel silicide (NiSi), palladium (Pd), iridium (Ir), platinum (Pt), cobalt (Co), cobalt silicide (CoSi), or aluminum silicide (AlSi), or any combination of two or more thereof. The electrode layer 670 may be deposited using a vapor deposition process such as, but not limited to: CVD, PECVD, ALD, PEALD, or PVD.

As shown in FIG. 4B, the bulk fill material 680 may be trimmed, using etching and/or planarization processes, to leave an exposed surface 682 on the bulk fill material 680 and expose an excess portion of the conformal liner 660 and an excess portion of the electrode layer 670. The excess portion of the conformal liner 660 and/or the excess portion of the electrode layer 670 may be doped using energetic charged particles to form doped regions (not shown) and then may be etched to remove the doped regions. The doped regions may or may not extend through the thickness of the conformal liner 660 or the electrode layer 670. Furthermore, the dopant may be selected such that the introduction of the dopant to the conformal liner 660 and/or the electrode layer 670 decreases an etch resistance of the conformal liner 660 and/or the electrode layer 670 to a pre-determined etch process, while the introduction of the dopant to the bulk fill material 680 increases an etch resistance of the bulk fill material 680 to the pre-determined etch process. Protection of the bulk fill material during the removal of the conformal liner 660 and/or the electrode layer 670 may reduce or prevent the formation of a recess at the exposed surface 682. The doping and etching may be alternatingly and sequentially performed until the excess portion 662 of the conformal liner 660 and/or the excess portion of the electrode layer 670 are removed.

For example, a dopant such as oxygen (O) may be introduced to the conformal liner 660 and/or electrode layer 670 to form an oxidized liner or oxidized electrode layer. Additionally, a dopant such as oxygen (O) may be introduced to the bulk fill material 680 to form an oxidized surface layer (e.g., $SiO_x$). When etching the conformal liner 660 and/or the electrode layer 670 using a halogen-containing plasma, such as plasma containing HBr, $Cl_2$, or $BCl_3$, the introduction of O to the conformal liner 660 and/or the electrode layer 670, as well as the bulk fill material 680, may increase the etch selectivity between these layers.

According to another example, the methods of etching described above may be utilized in the production of magnetic tunnel junctions for read-heads in hard disk drives. Magnetic tunnel junctions comprise two ferromagnetic films separated by a thin insulation film. The ferromagnetic films may, for instance, include CoFe or NiFe, which require patterning via etch techniques. To improve the ability for etching these materials, they may be subjected to treatment by energetic charged particles to alter their etch resistance prior to performing an etching process. For example, oxygen (O) may be introduced to the ferromagnetic film to reduce its etch resistance for metal oxide etch chemistries.

According to yet another example, the methods of etching described above may be utilized in the production of ReRAM devices. ReRAM devices may comprise a series of thin films that include Ti:NiO and $TiO_x$, which require patterning via etch techniques. To improve the ability for etching these materials, they may be subjected to treatment by energetic charged particles to alter their etch resistance prior to performing an etching process. For example, silicon (Si) may be introduced to the Ti:NiO film to reduce its etch resistance for silicon etch chemistries.

Figure 5:
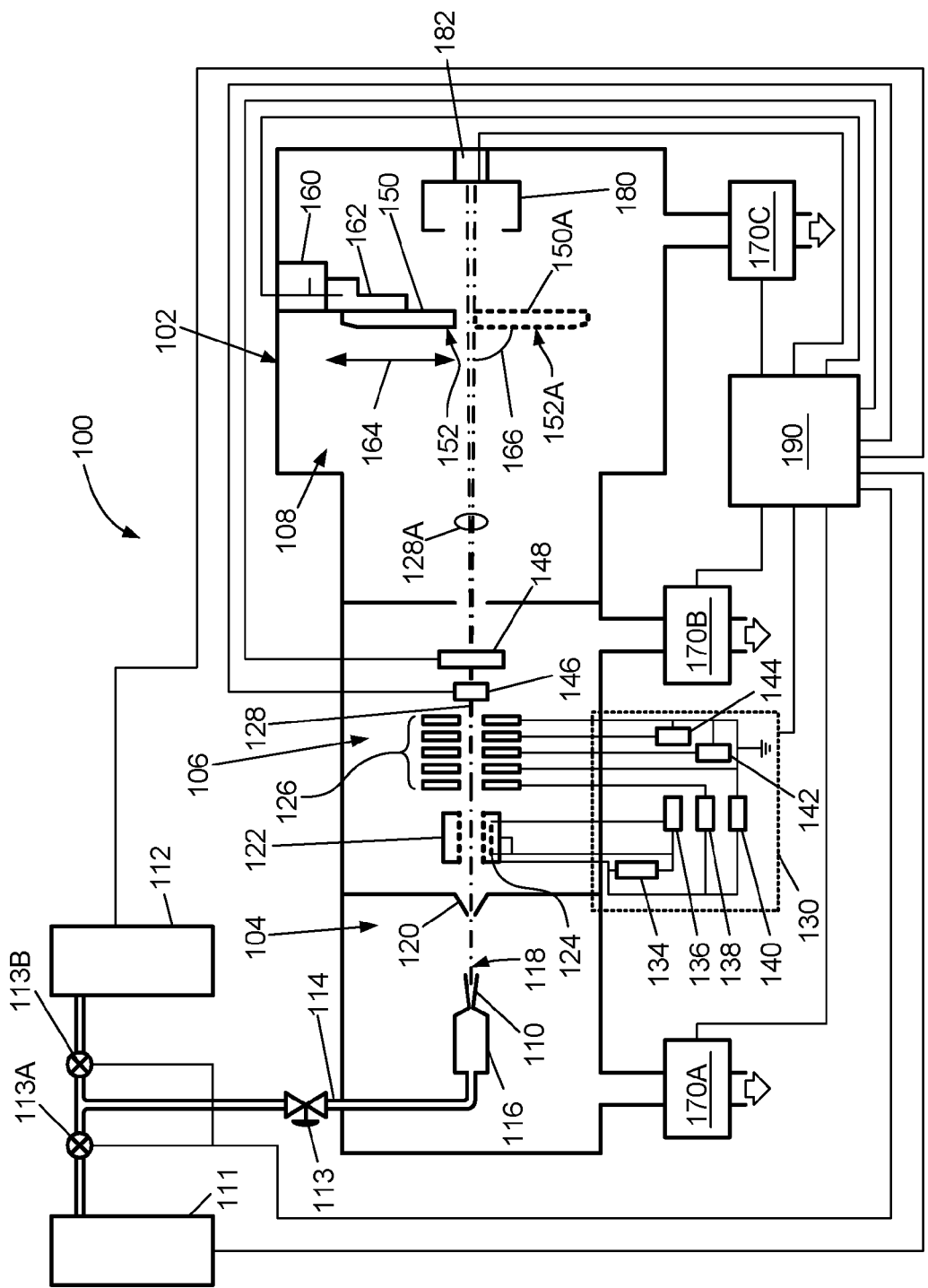
FIG. 5 is an illustration of a GCIB processing system.

Referring now to FIG. 5, a GCIB processing system 100 for doping or modifying the composition of a material layer or structure as described above is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 5, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

Although specific examples are provided for transistor gate and trench capacitor applications, the methods of etching, as described above, may be utilized in any substrate processing wherein etching is necessitated.

As shown in FIG. 5, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The material composition can include the principal atomic or molecular species of the elements desired to be introduced to the material layer.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 5, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 4, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 4, the beam electronics 130 include an extraction power supply 138 that provides voltage $V_{EE}$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{ACC}$ to bias one of the high voltage electrodes 126 with respect to the ionizer 122 so as to result in a total GCIB acceleration energy equal to about $V_{ACC}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{ACC}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 5, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 5, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 5, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 6:
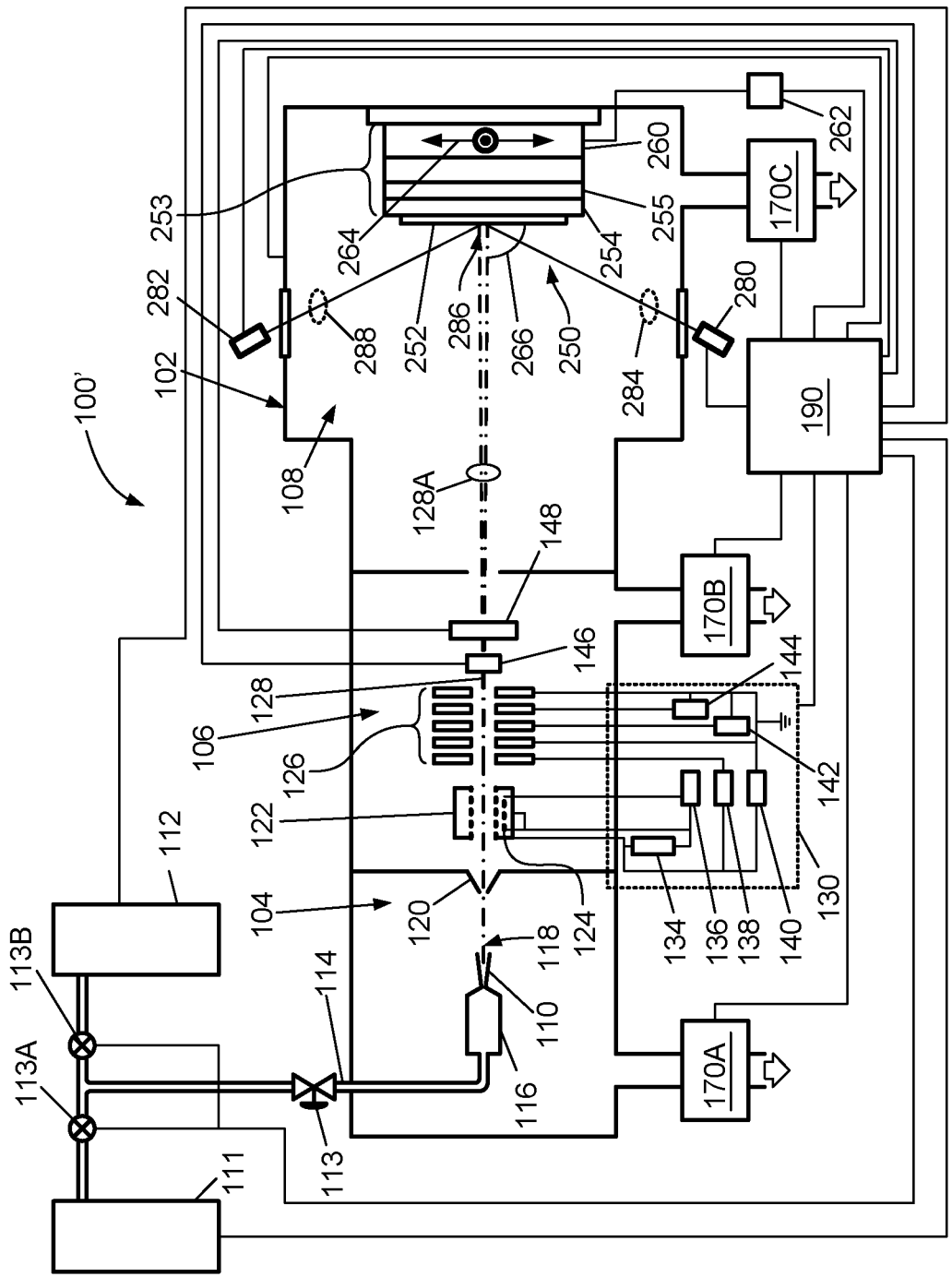
FIG. 6 is another illustration of a GCIB processing system.

In the embodiment shown in FIG. 6, the GCIB processing system 100' can be similar to the embodiment of FIG. 5 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 5) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 7:
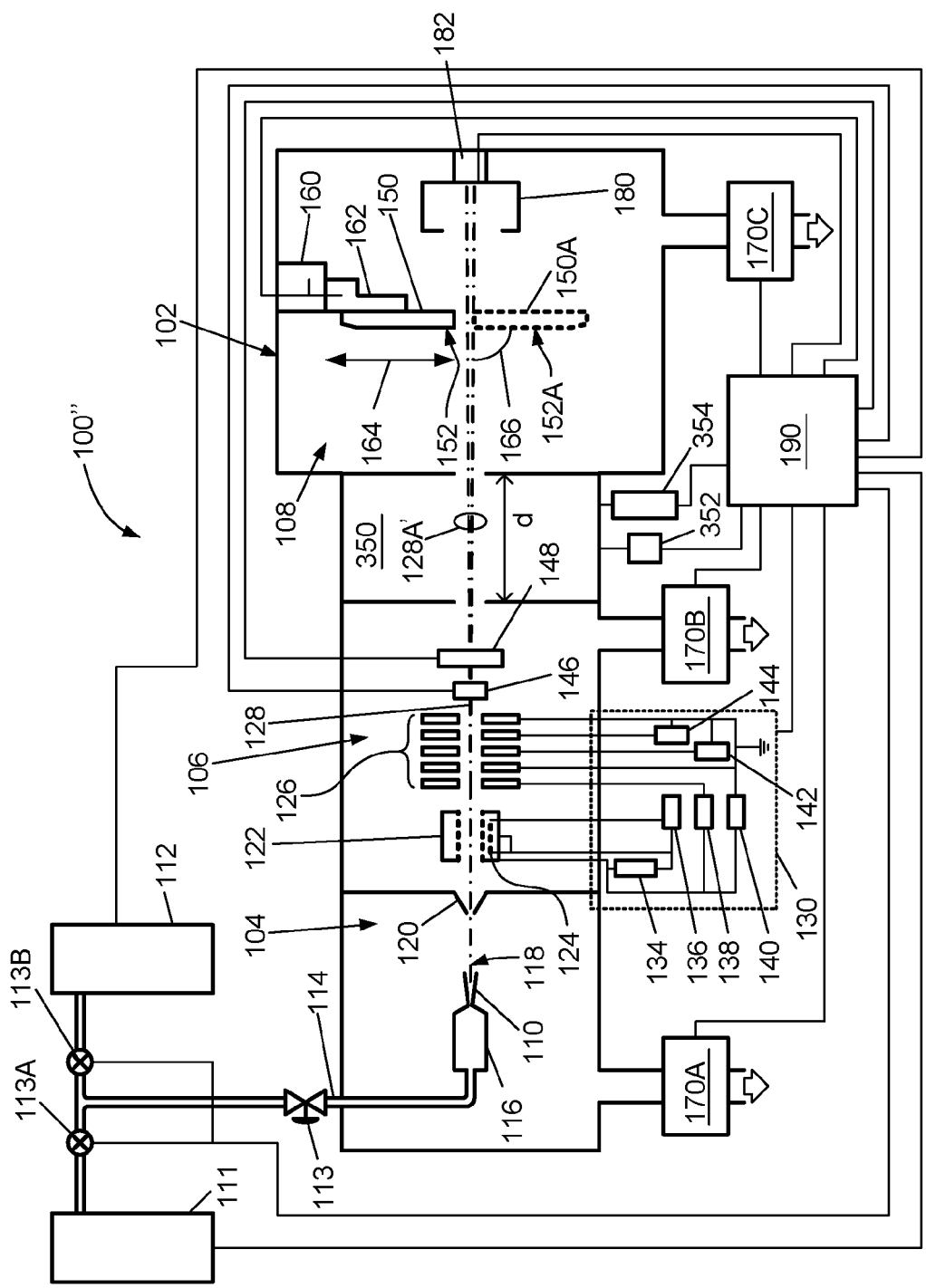
FIG. 7 is yet another illustration of a GCIB processing system.

In the embodiment shown in FIG. 7, the GCIB processing system 100" can be similar to the embodiment of FIG. 5 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 8:
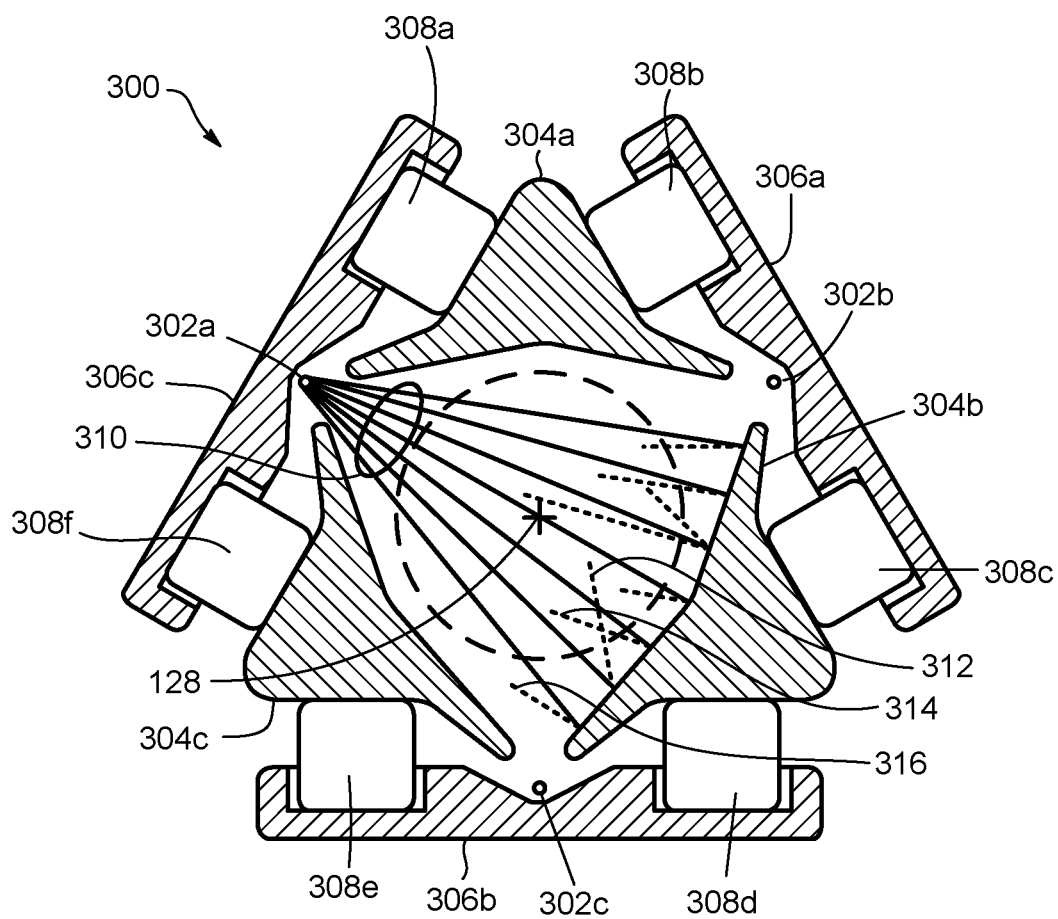
FIG. 8 is an illustration of an ionization source for a GCIB processing system.

Referring now to FIG. 8, a section 300 of a gas cluster ionizer (122, FIGS. 5, 6 and 7) for ionizing a gas cluster jet (gas cluster beam 118, FIGS. 5, 6 and 7) is shown. The section 300 is normal to the axis of GCIB 128. For typical gas cluster sizes (2000 to 15000 atoms), clusters leaving the skimmer aperture (120, FIGS. 5, 6 and 7) and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 8 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Figure 9:
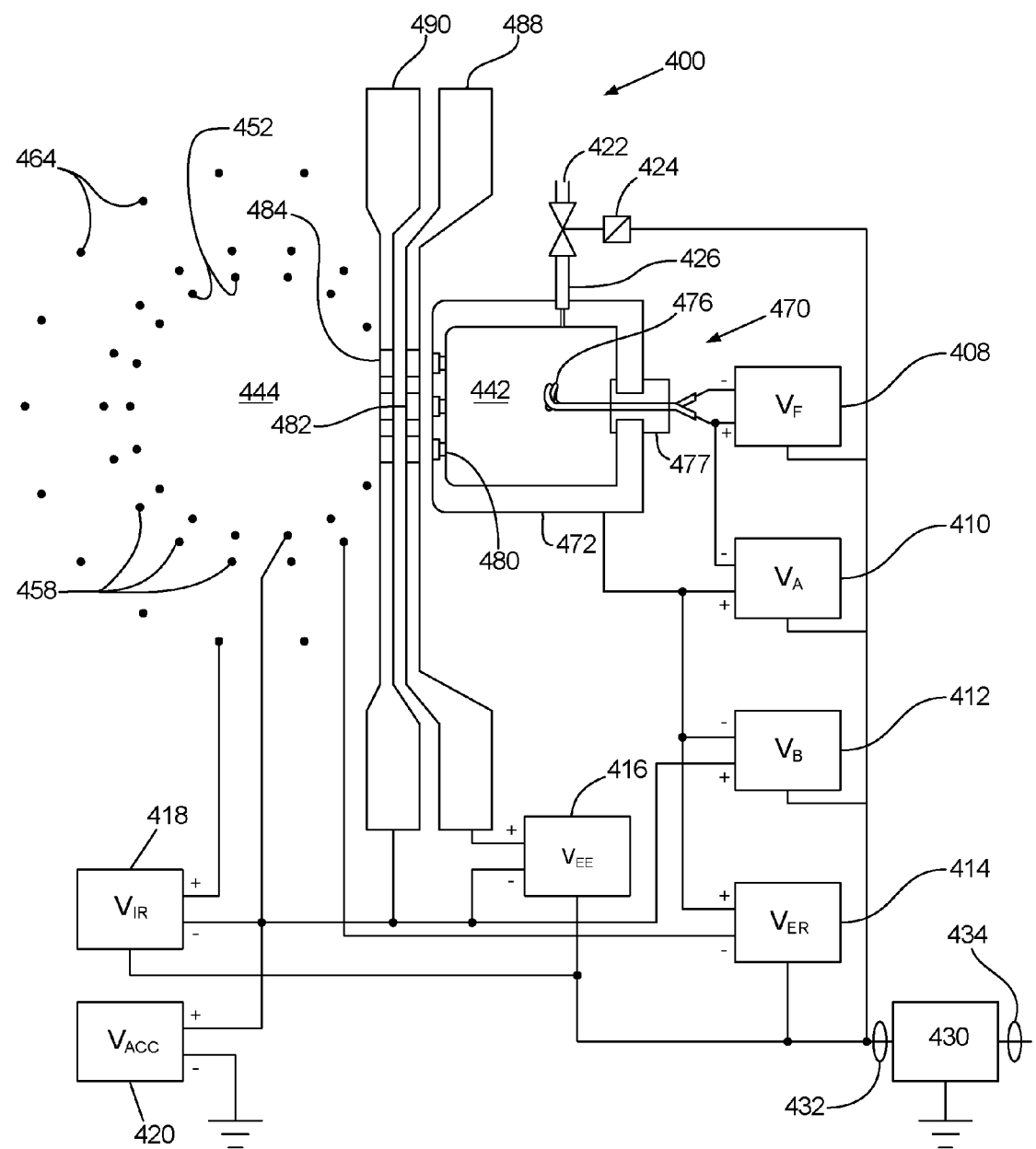
FIG. 9 is an illustration of another ionization source for a GCIB processing system.

Alternatively, ionizers may use electron extraction from plasma to ionize clusters. The geometry of these ionizers is quite different from the three filament ionizer described above, but the principles of operation and the ionizer control are very similar. Referring now to FIG. 9, a section 400 of a gas cluster ionizer (122, FIGS. 5, 6 and 7) for ionizing a gas cluster jet (gas cluster beam 118, FIGS. 5, 6 and 7) is shown. The section 400 is normal to the axis of GCIB 128. For typical gas cluster sizes (2000 to 15000 atoms), clusters leaving the skimmer aperture (120, FIGS. 5, 6 and 7) and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 9 illustrates a self-neutralizing ionizer. As with other ionizers, gas clusters are ionized by electron impact.

The ionizer includes an array of thin rod anode electrodes 452 that is supported and electrically connected by a support plate (not shown). The array of thin rod anode electrodes 452 is substantially concentric with the axis of the gas cluster beam (e.g., gas cluster beam 118, FIGS. 5, 6 and 7). The ionizer also includes an array of thin rod electron-repeller rods 458 that is supported and electrically connected by another support plate (not shown). The array of thin rod electron-repeller electrodes 458 is substantially concentric with the axis of the gas cluster beam (e.g., gas cluster beam 118, FIGS. 5, 6 and 7). The ionizer further includes an array of thin rod ion-repeller rods 464 that is supported and electrically connected by yet another support plate (not shown). The array of thin rod ion-repeller electrodes 464 is substantially concentric with the axis of the gas cluster beam (e.g., gas cluster beam 118, FIGS. 5, 6 and 7).

Energetic electrons are supplied to a beam region 444 from a plasma electron source 470. The plasma electron source 470 comprises a plasma chamber 472 within which plasma is formed in plasma region 442. The plasma electron source 470 further comprises a thermionic filament 476, a gas entry aperture 426, and a plurality of extraction apertures 480. The thermionic filament 476 is insulated from the plasma chamber 470 via insulator 477. As an example, the thermionic filament 476 may include a tungsten filament having one-and-a-half turns in a "pigtail" configuration.

The section 400 of the gas cluster ionizer comprises an electron-acceleration electrode 488 having plural apertures 482. Additionally, the section 400 comprises an electron-deceleration electrode 490 having plural apertures 484. The plural apertures 482, the plural apertures 484, and the plural extraction apertures 480 are all aligned from the plasma region 442 to the beam region 444.

Plasma forming gas, such as a noble gas, is admitted to the plasma chamber 472 through gas entry aperture 426. An insulated gas feed line 422 provides pressurized plasma forming gas to a remotely controllable gas valve 424 that regulates the admission of plasma forming gas to the plasma chamber 472.

A filament power supply 408 provides filament voltage ($V_F$) for driving current through thermionic filament 476 to stimulate thermo-electron emission. Filament power supply 408 controllably provides about 140 to 200 A (amps) at 3 to 5 V (volts). An arc power supply 410 controllably provides an arc voltage ($V_A$) to bias the plasma chamber 472 positive with respect to the thermionic filament 476. Arc power supply 410 is typically operated at a fixed voltage, typically about 35 V, and provides means for accelerating the electrons within the plasma chamber 472 for forming plasma. The filament current is controlled to regulate the arc current supplied by the arc power supply 410. Arc power supply 410 is capable of providing up to 5 A arc current to the plasma arc.

Electron deceleration electrode 490 is biased positively with respect to the plasma chamber 472 by electron bias power supply 412. Electron bias power supply 412 provides bias voltage ($V_B$) that is controllably adjustable over the range of from 30 to 400 V. Electron acceleration electrode 488 is biased positively with respect to electron deceleration electrode 490 by electron extraction power supply 416. Electron extraction power supply 416 provides electron extraction voltage ($V_{EE}$) that is controllable in the range from 20 to 250 V. An acceleration power supply 420 supplies acceleration voltage ($V_{ACC}$) to bias the array of thin rod anode electrodes 452 and electron deceleration electrode 490 positive with respect to earth ground. $V_{ACC}$ is the acceleration potential for gas cluster ions produced by the gas cluster ionizer shown in section 400 and is controllable and adjustable in the range from 1 to 100 kV. An electron repeller power supply 414 provides electron repeller bias voltage ($V_{ER}$) for biasing the array of thin rod electron-repeller electrodes 458 negative with respect to $V_{ACC}$. $V_{ER}$ is controllable in the range of from 50 to 100 V. An ion repeller power supply 418 provides ion repeller bias voltage ($V_{IR}$) to bias the array of thin rod ion-repeller electrodes 464 positive with respect to $V_{ACC}$. $V_{IR}$ is controllable in the range of from 50 to 150 V.

A fiber optics controller 430 receives electrical control signals on cable 434 and converts them to optical signals on control link 432 to control components operating at high potentials using signals from a grounded control system. The fiber optics control link 432 conveys control signals to remotely controllable gas valve 424, filament power supply 408, arc power supply 410, electron bias power supply 412, electron repeller power supply 414, electron extraction power supply 416, and ion repeller power supply 418.

For example, the ionizer design may be similar to the ionizer described in U.S. Pat. No. 7,173,252, entitled "Ionizer and method for gas-cluster ion-beam formation"; the content of which is incorporated herein by reference in its entirety.

The gas cluster ionizer (122, FIGS. 4, 5 and 6) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of etching, comprising:
providing a substrate having a first material layer and a second material layer different in composition from said first material layer, wherein said first material layer is characterized by a first nominal etch rate and said second material layer is characterized by a second nominal etch rate different than said first nominal etch rate when said first material layer and said second material layer are simultaneously exposed to a pre-determined etch process;

simultaneously exposing said first material layer and said second material layer to a gas cluster ion beam (GCIB) to adjust a concentration of an element in each of said first material layer and said second material layer; and following said exposing, simultaneously etching said first and second material layers differentially using said pre-determined etch process, wherein said exposing said first material layer and said second material layer increases an etch rate of said first material layer relative to said first nominal etch rate, decreases an etch rate of said second material layer relative to said second nominal etch rate, and increases an etch selectivity between said first material layer and said second material layer relative to a nominal etch selectivity achievable by said etching without said adjusting, said nominal etch selectivity being defined as the ratio of said first nominal etch rate to said second nominal etch rate.

2. The method of claim 1, wherein said exposing comprises introducing one or more elements selected from the group consisting of B, C, Si, Ge, N, P, As, O, S, F, Cl, and Br.

3. The method of claim 1, wherein said exposing comprises:

establishing said gas cluster ion beam (GCIB) containing said element as a dopant;

selecting a beam energy, a beam energy distribution, a beam focus, and a beam dose to achieve a desired concentration profile of said dopant in said first and second material layers;

accelerating said GCIB to achieve said beam energy;

focusing said GCIB to achieve said beam focus;

irradiating said accelerated GCIB onto at least said portion of said first and second material layers according to said beam dose; and introducing said dopant to at least said portion of said first and second material layers to achieve said desired concentration profile of said dopant.

4. The method of claim 3, wherein said beam dose ranges from about $1\times10^{15}$ clusters per cm$^2$ to about $1\times10^{17}$ clusters per cm$^2$.

5. The method of claim 3, wherein said beam energy ranges from about 1 keV to about 70 keV.

6. The method of claim 3, wherein said GCIB comprises an energy per atom ratio ranging from about 0.25 eV per atom to about 100 eV per atom.

7. The method of claim 1, wherein said pre-determined etch process comprises a wet etch process, a dry etch process, a dry plasma etch process, a dry non-plasma etch process, a chemical oxide removal process, an ion milling process, or a GCIB process, or any combination of two or more thereof.

8. The method of claim 1, wherein said pre-determined etch process comprises forming plasma from a halogen-containing gas.

9. A method of etching, comprising:

providing a substrate having a first material layer and a second material layer different in composition from said first material layer, wherein said first material layer is characterized by a first nominal etch rate and said second material layer is characterized by a second nominal etch rate different than said first nominal etch rate when said first material layer and said second material layer are simultaneously exposed to a pre-determined etch process that removes material from both said first and second material layers;

doping said first material layer and said second material layer using energetic charged particles to form a first doped material layer and a second doped material layer; and following said doping, differentially etching said first doped material layer and said second doped material layer using simultaneous exposure to said pre-determined etch process, wherein said doping said first material layer and said second material layer changes an etch rate of said first material layer relative to said first nominal etch rate, and changes an etch selectivity between said first doped material layer and said second doped material layer relative to a nominal etch selectivity achievable by said etching without said doping, said nominal etch selectivity being defined as the ratio of said first nominal etch rate to said second nominal etch rate.

10. The method of claim 9, wherein said doping comprises introducing one or more elements selected from the group consisting of B, C, Si, Ge, N, P, As, O, S, F, Cl, and Br.

11. The method of claim 9, wherein said doping comprises introducing a dopant using a gas cluster ion beam (GCIB) process, an ion beam implant process, or a plasma immersion ion implant process, or any combination of two or more thereof.

12. The method of claim 9, wherein said doping comprises:

establishing a gas cluster ion beam (GCIB) containing a dopant;

selecting a beam energy, a beam energy distribution, a beam focus, and a beam dose to achieve a desired concentration profile of said dopant in said first and second doped material layers;

accelerating said GCIB to achieve said beam energy;

focusing said GCIB to achieve said beam focus;

irradiating said accelerated GCIB onto at least a portion of said first and second material layers according to said beam dose; and introducing said dopant to said at least a portion of said first and second material layers to achieve said desired concentration profile of said dopant.

13. The method of claim 9, wherein said etching comprises a wet etch process, a dry etch process, a dry plasma etch process, a dry non-plasma etch process, a chemical oxide removal process, an ion milling process, or a GCIB process, or any combination of two or more thereof.

14. The method of claim 9, wherein a penetration depth for the doping is less than a target depth to be etched into the thickness of said first material layer, the method further comprising:

alternatingly and sequentially performing said doping and said etching to etch said first doped material layer to said target depth and to differentially etch said first doped material layer and said second doped material layer.

15. The method of claim 9, wherein said first material layer is an electrode layer for a magnetic tunnel junction that includes a metal-containing layer, and said second material layer includes a patterned mask layer for patterning said electrode layer, and wherein said first material layer and said second material layer are doped with oxygen.

16. The method of claim 9, wherein said first material layer is a layer in a resistive RAM device that includes a metal-containing layer, and said second material layer includes a patterned mask layer for patterning said resistive RAM device, and wherein said first material layer and said second material layer are doped with silicon.

17. The method of claim 9, wherein said first material layer is a liner or electrode layer in a trench capacitor that includes a metal-containing layer, and said second material layer includes a bulk fill material for said trench capacitor, and wherein said first material layer and said second material layer are doped with oxygen.

18. The method of claim 9, wherein said first material layer is a high-k or gate electrode layer in a transistor gate that includes a metal-containing layer, and said second material layer includes a patterned mask layer for patterning said transistor gate, and wherein said first material layer and said second material layer are doped with oxygen.

* * * * *